US009640741B1

(12) United States Patent
Lin (10) Patent No.: US 9,640,741 B1
(45) Date of Patent: May 2, 2017

(54) CONCENTRATING LENS OF A LIGHT EMITTING DIODE LAMP

(71) Applicant: ARTLED TECHNOLOGY CORP., New Taipei (TW)

(72) Inventor: Chan-Ching Lin, New Taipei (TW)

(73) Assignee: ARTLED TECHNOLOGY CORP., New Taipei (TW)

( * ) Notice: Subject to any disclaimer, the term of this patent is extended or adjusted under 35 U.S.C. 154(b) by 0 days.

(21) Appl. No.: 14/929,382

(22) Filed: Nov. 1, 2015

(51) Int. Cl.
| H01L 33/00 | (2010.01) |
| H01L 33/58 | (2010.01) |
| F21V 5/04 | (2006.01) |

(52) U.S. Cl.
CPC .............. *H01L 33/58* (2013.01); *F21V 5/048* (2013.01)

(58) Field of Classification Search
CPC .............. H01L 33/58; H01L 27/14627; H01L 31/0543; H01L 33/508; H01L 29/00; H01L 29/06; F21V 5/048
See application file for complete search history.

(56) References Cited

U.S. PATENT DOCUMENTS

| 6,961,190 | B1 * | 11/2005 | Tamaoki | ................ B43K 29/10 |
| | | | | 257/E25.021 |
| 8,696,175 | B2 * | 4/2014 | Yoon | ........................ F21V 5/04 |
| | | | | 362/317 |
| 8,805,131 | B2 * | 8/2014 | Shiraishi | .............. G02B 6/4214 |
| | | | | 385/14 |
| 2002/0185763 | A1 * | 12/2002 | Pegram | ............... B29C 37/0003 |
| | | | | 264/2.3 |
| 2005/0201118 | A1 * | 9/2005 | Godo | ........................ F21V 5/04 |
| | | | | 362/555 |
| 2006/0291245 | A1 * | 12/2006 | Shimada | ................... F21K 9/00 |
| | | | | 362/612 |
| 2010/0073532 | A1 * | 3/2010 | Yano | ........................ B26D 1/00 |
| | | | | 348/294 |
| 2010/0195335 | A1 * | 8/2010 | Allen | ...................... F21V 5/048 |
| | | | | 362/309 |
| 2013/0114022 | A1 * | 5/2013 | Iiyama | ............... G02B 19/0014 |
| | | | | 349/64 |
| 2013/0161665 | A1 * | 6/2013 | Kuwaharada | ........... H01L 33/54 |
| | | | | 257/88 |
| 2014/0177234 | A1 * | 6/2014 | Wang He | ................ F21V 5/048 |
| | | | | 362/311.02 |

* cited by examiner

*Primary Examiner* — Yosef Gebreyesus
(74) *Attorney, Agent, or Firm* — Pai Patent & Trademark Law Firm; Chao-Chang David Pai (57) ABSTRACT

Provided is a concentrating lens of a light emitting diode lamp comprising a lens body. The lens body comprises a top portion, a bottom portion opposite the top portion, a light output surface positioned on the top portion, an optical surface formed concavely on the light output surface, and a light input surface concavely formed on the bottom portion and towards the top portion. The light input surface is disposed on a same axis with the optical surface. The light input surface comprises a light input side plane and a light input concave plane connected with the light input side plane. The concentrating lens is capable of distributing the light of LED to positions on each of the side walls of a light box close to and distal from the LED, and allowing the light emitted from the LED to lighten the light box uniformly.

17 Claims, 12 Drawing Sheets

CONCENTRATING LENS OF A LIGHT EMITTING DIODE LAMP

BACKGROUND

1. Technical Field

The present invention relates to a concentrating lens of a light emitting diode (LED) lamp.

2. Description of the Prior Art(s)

As an LED is high in luminous efficiency, durable in service life, and has no toxic substances, the LED lamp replaces the conventional fluorescent lamp to be the light source of the light box.

With reference to FIGS. 9 to 12, to project the light emitted from an LED 70 to the two opposite side walls 61 of the light box 60, the LED lamp comprises a concentrating lens 50. The concentrating lens 50 comprises a top 51, a bottom 52, a light output surface 53 disposed on the top 51, a light input surface 54 disposed on the bottom 52, and a recess 55. The light input surface 54 comprises a convex plane 541 and a surrounding plane 542 connected with the convex plane 541. The recess 55 is formed concavely on the bottom 52 and towards the top 51. The recess 55 is surrounded by the light input surface 54. The recess 55 comprises a bottom opening 551 surrounded by the surrounding plane 542.

As shown in FIGS. 9, and 11 to 13, the LED 70 and the concentrating lens 50 are mounted on an end wall of the light box 60. The LED 70 faces the light input surface 54. After the light emitted by the LED 70 enters the concentrating lens 50 via the light input surface 54, the light departs from the concentrating lens 50 via the light output surface 55 and is distributed on the side walls 61 of the light box 60 for lighting up the light box 60.

However, the concentrating lens 50 concentrates the light emitted by the LED 70 only to the position on each of the side walls 61 distal from the LED 70. The concentrating lens 50 hardly distributes the light to the position on each of the side walls 61 close to the LED 70. Therefore, the concentrating lens 50 is incapable of allowing the light emitted from the LED 70 to light up the light box 60 uniformly.

To overcome the shortcomings, the present invention provides a concentrating lens of a light emitting diode lamp to mitigate or obviate the aforementioned problems.

SUMMARY

The objective of the present invention is to provide a concentrating lens of a light emitting diode lamp. The concentrating lens is capable of distributing the light emitted by the LED to the positions on each of the side walls of a light box close to and distal from the LED simultaneously, and allowing the light emitted from the LED to light up the light box uniformly.

The concentrating lens of a light emitting diode lamp in accordance with the present invention comprises a lens body. The lens body comprises a top portion, a bottom portion opposite the top portion, a light output surface positioned on the top portion, an optical surface formed concavely on the light output surface, and a light input surface concavely formed on the bottom portion and towards the top portion. The light input surface is positioned on a same axis with the optical surface. The light input surface comprises a light input side plane and a light input concave plane connected with the light input side plane.

Preferably, the lens body comprises a top recess surrounded by the optical surface. The top recess comprises a top opening connected with the light output surface, a recess base opposite the top opening, and a width decreasing gradually from the top opening to the recess base.

More preferably, a ratio of a width of the top opening to a width of the recess base ranges from 1:2 to 1:3.5.

More preferably, a distance between the light input concave plane and the recess base ranges from 1 mm to 3 mm.

Preferably, the light input side plane comprises an inner end connected with the light input concave plane and an outer end opposite the inner end. The lens body further comprises a bottom groove surrounded by the light input side plane. The bottom groove comprises a bottom opening surrounded by the outer end, an end opening surrounded by the inner end, and a width decreasing gradually from the bottom opening to the end opening.

More preferably, a ratio of a width of the end opening to a width of the bottom opening ranges from 1:1.1 to 1:2.

Preferably, a width of the top portion is larger than a width of the bottom portion, the lens body further comprises a body side surface connected between the top portion and the bottom portion, and the body side surface is a slanting surface.

Preferably, the concentrating lens further comprises a supporting wall disposed around the lens body, the supporting wall comprises a connecting portion connected with the top portion of the lens body, and the connecting portion is spaced from the bottom portion and the body side surface.

More preferably, the supporting wall and the lens body are formed as one piece, and the supporting wall is translucent.

Preferably, the optical surface is a conical surface and the light input concave plane is a circular concave plane.

By the light input concave plane of the light input surface and the optical surface, the concentrating lens effectively distributes the light emitted by the LED to the positions on each of the side walls of a light box not only distal from, but also close to the LED, thereby allowing the LED to light up the light box uniformly.

Other objectives, advantages, and novel features of the invention will become more apparent from the following detailed description when taken in conjunction with the accompanying drawings.

DETAILED DESCRIPTION

Figure 1:
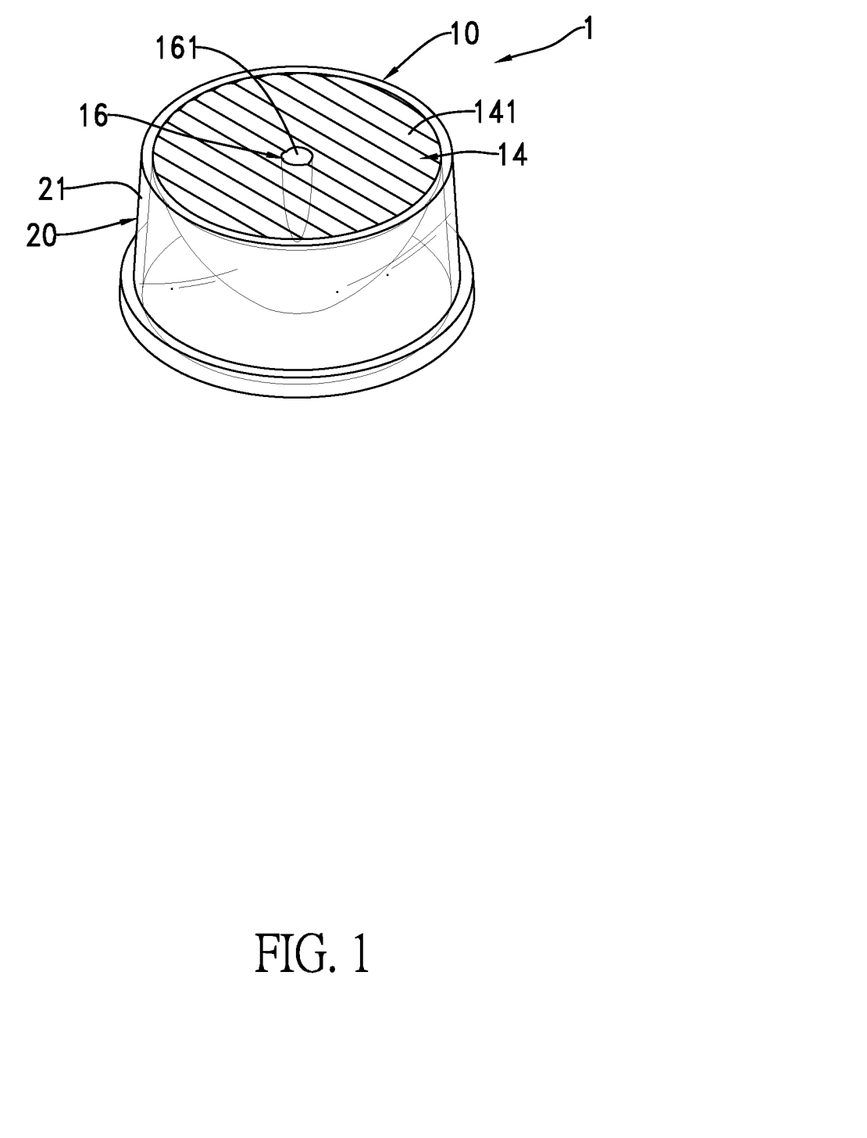
FIG. 1 is a perspective view of a concentrating lens of a light emitting diode lamp in accordance with the present invention.

With reference to FIG. 1, a concentrating lens 1 of a light emitting diode lamp in accordance with the present invention comprises a lens body 10 and a supporting wall 20.

Figure 2:
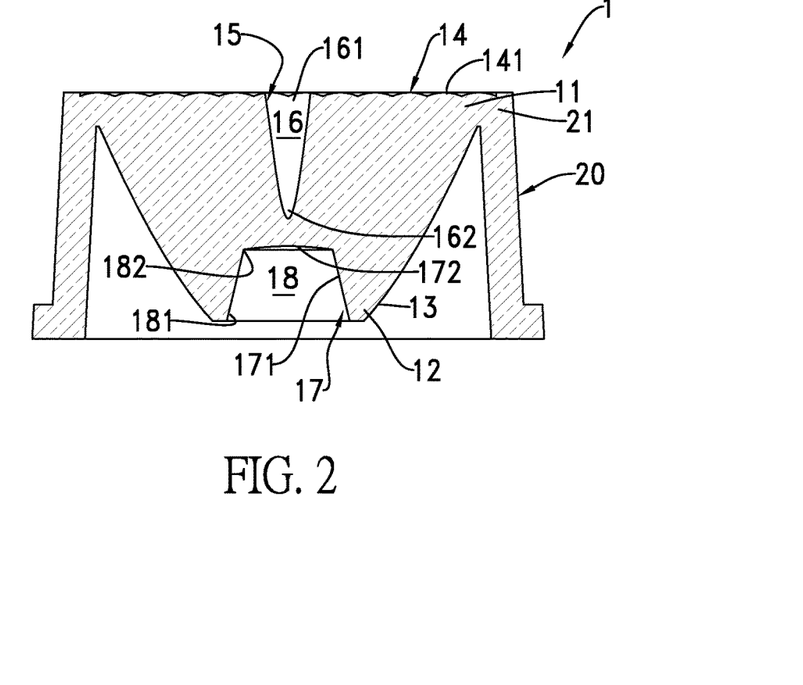
FIG. 2 is a cross sectional side view of the concentrating lens in FIG. 1.

With reference to FIGS. 1 and 2, the lens body 10 is translucent. The lens body 10 comprises a top portion 11, a bottom portion 12 opposite the top portion 11, a body side surface 13, a light output surface 14 positioned on the top portion 11, an optical surface 15, a top recess 16, a light input surface 17, and a bottom groove 18. The width of the top portion 11 is larger than the width of the bottom portion 12. The body side surface 13 is connected between the top portion 11 and the bottom portion 12. The body side surface 13 is a slanting surface. The light output surface 14 comprises a wavy structure 141.

Figure 3:
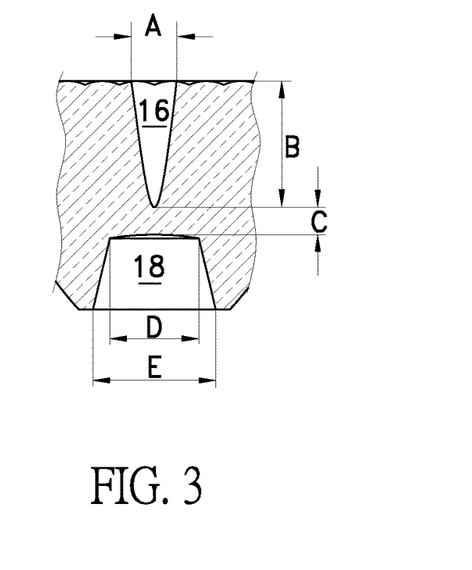
FIG. 3 is a partial cross sectional side view of the concentrating lens in FIG. 1.
Figure 4:
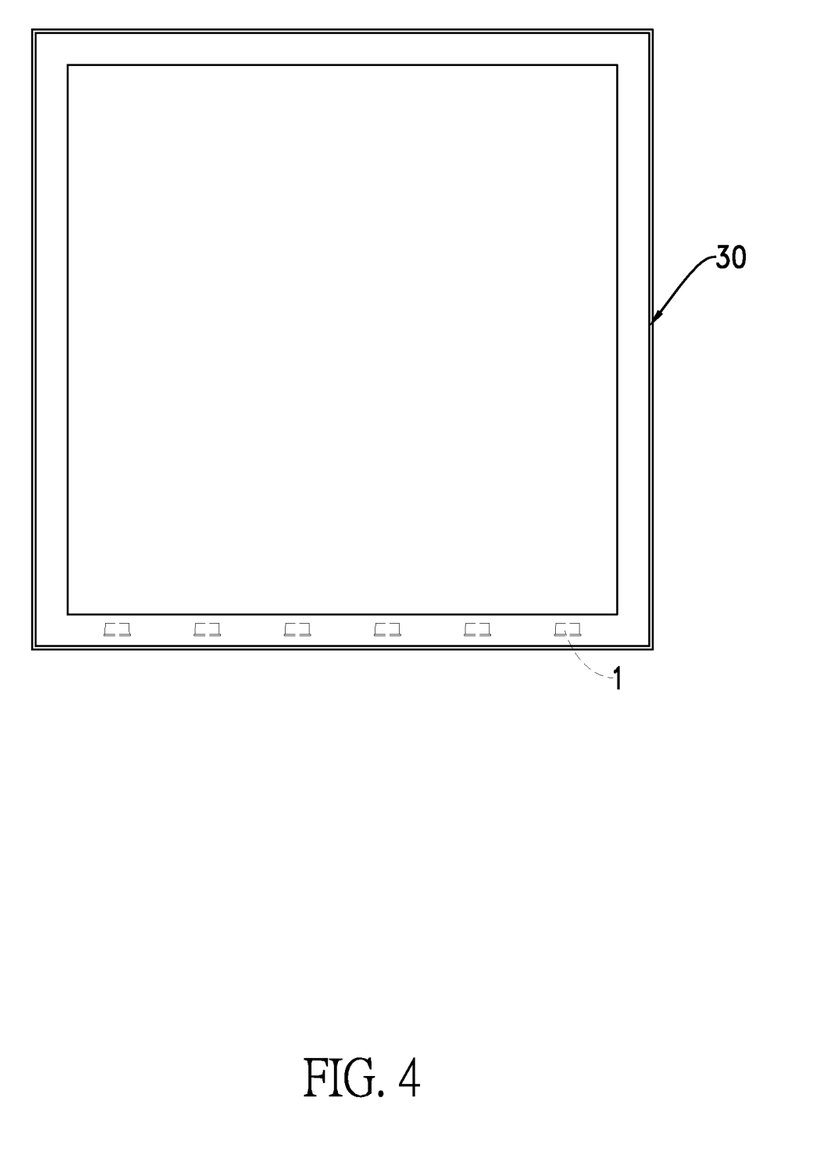
FIG. 4 is a schematic view showing an operational state of the concentrating lens in FIG. 1.
Figure 5:
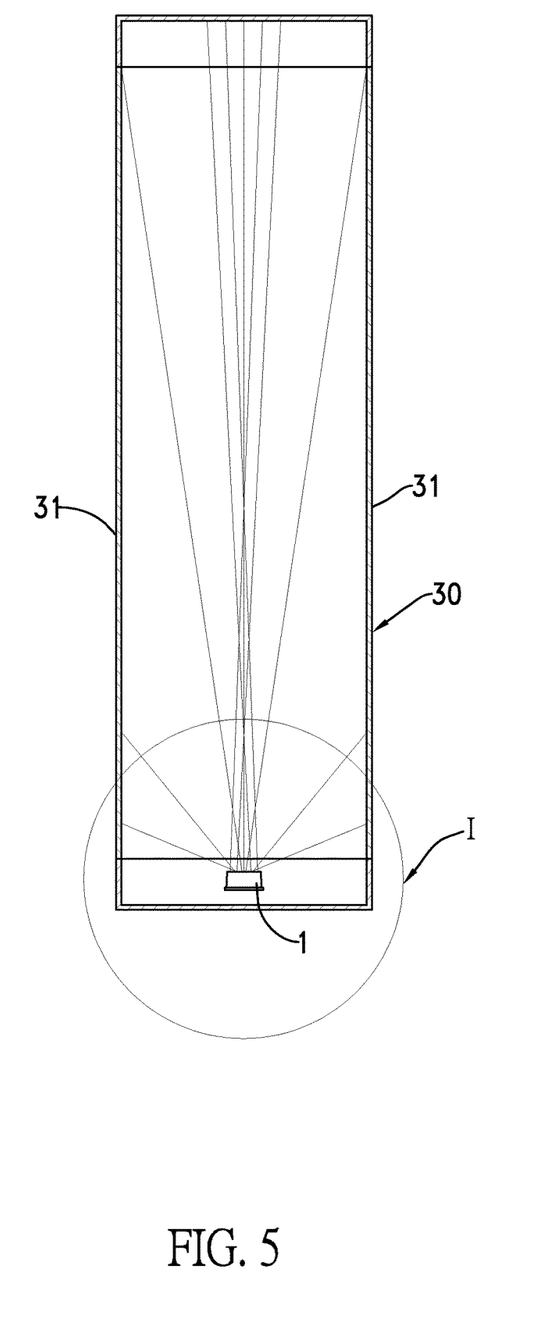
FIG. 5 is a schematic view showing an operational state of the concentrating lens in FIG. 1.
Figure 6:
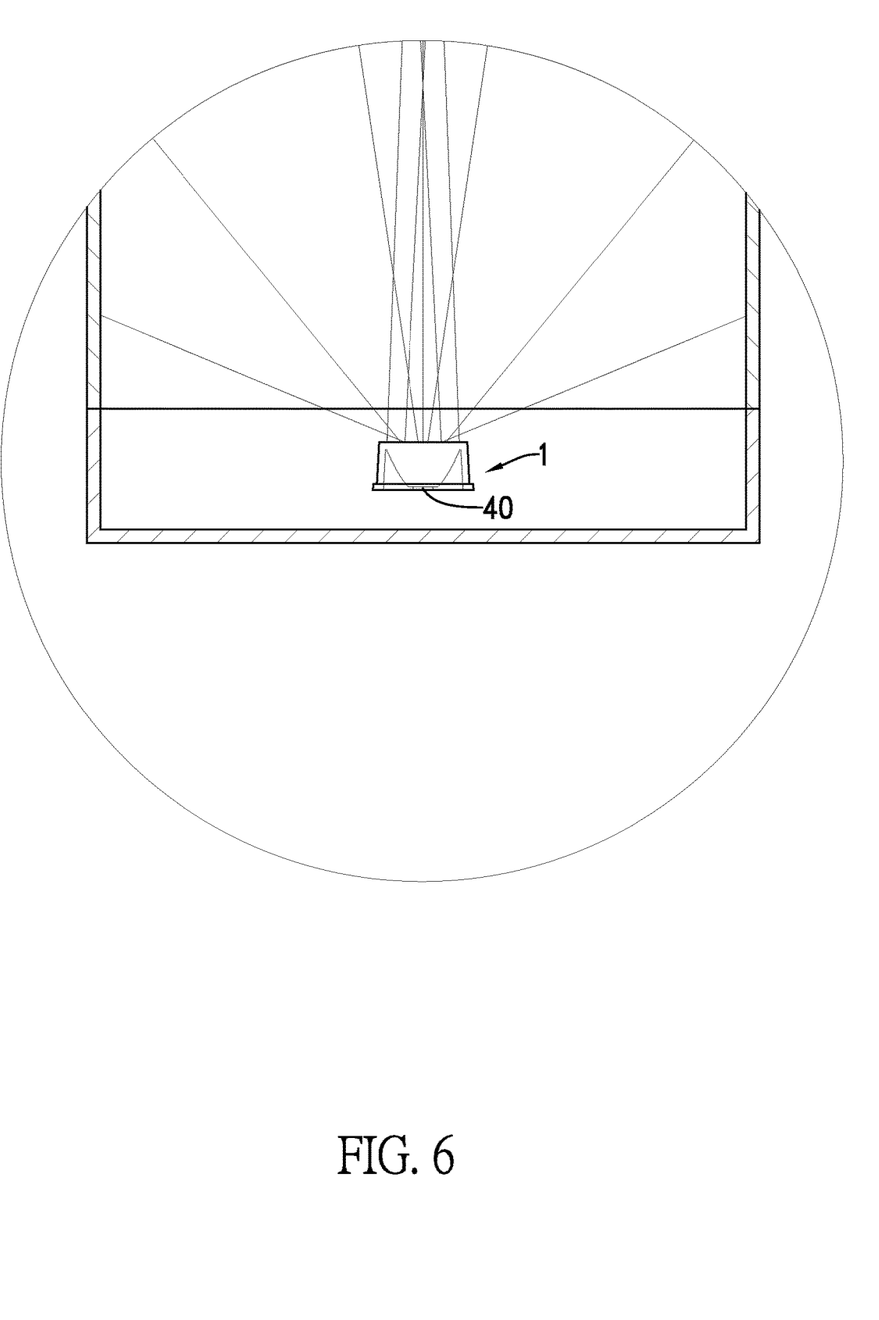
FIG. 6 is an enlarged view of an encircled area I in FIG. 5.
Figure 7:
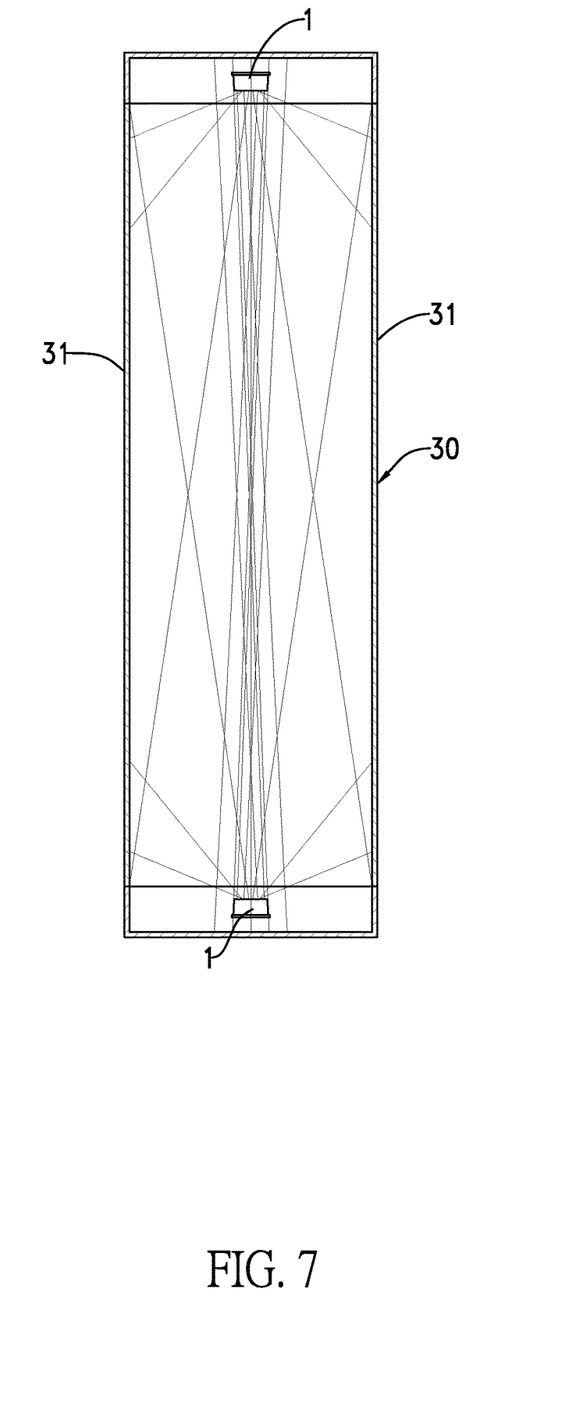
FIG. 7 is a schematic view showing an operational state of the concentrating lens in FIG. 1.
Figure 8:
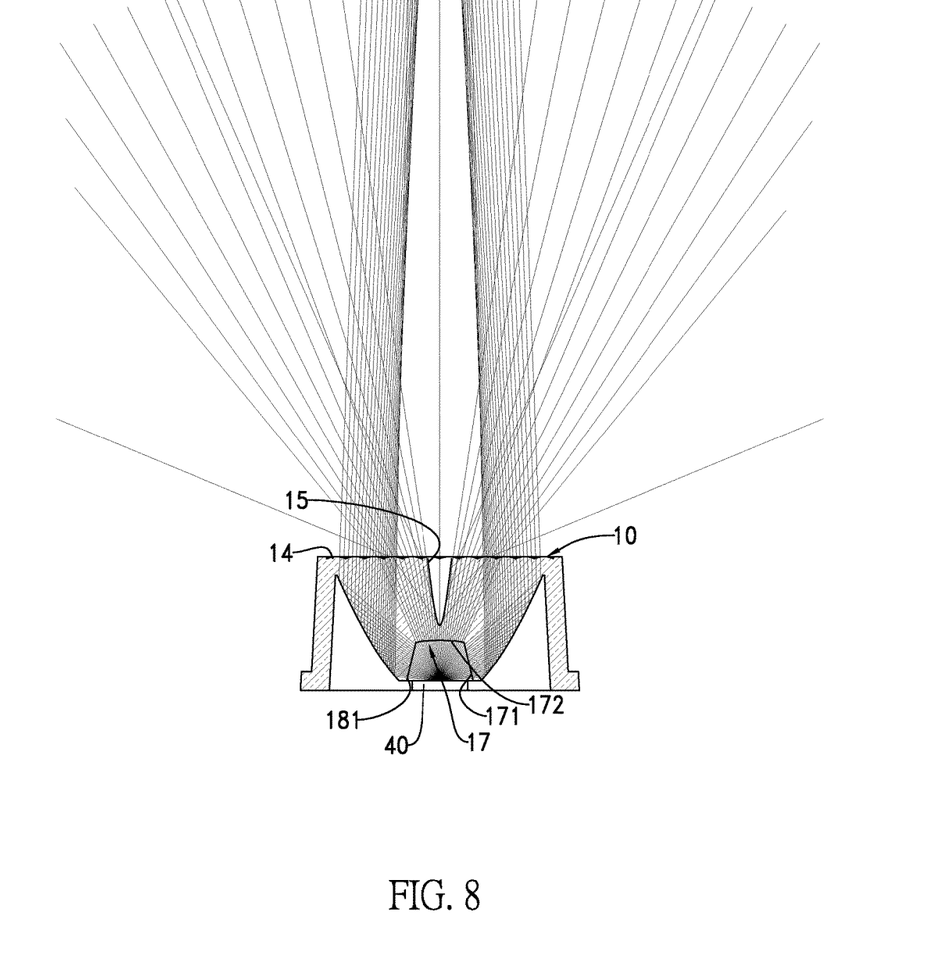
FIG. 8 is a schematic view showing an operational state of the concentrating lens in FIG. 1.
Figure 9:
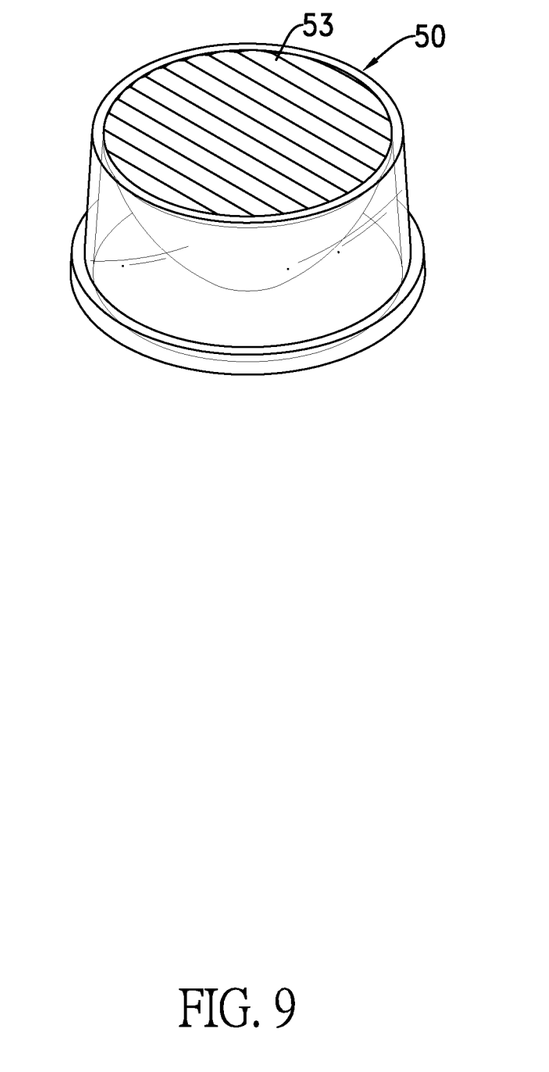
FIG. 9 is a perspective view of a concentrating lens in accordance with the prior art.
Figure 10:
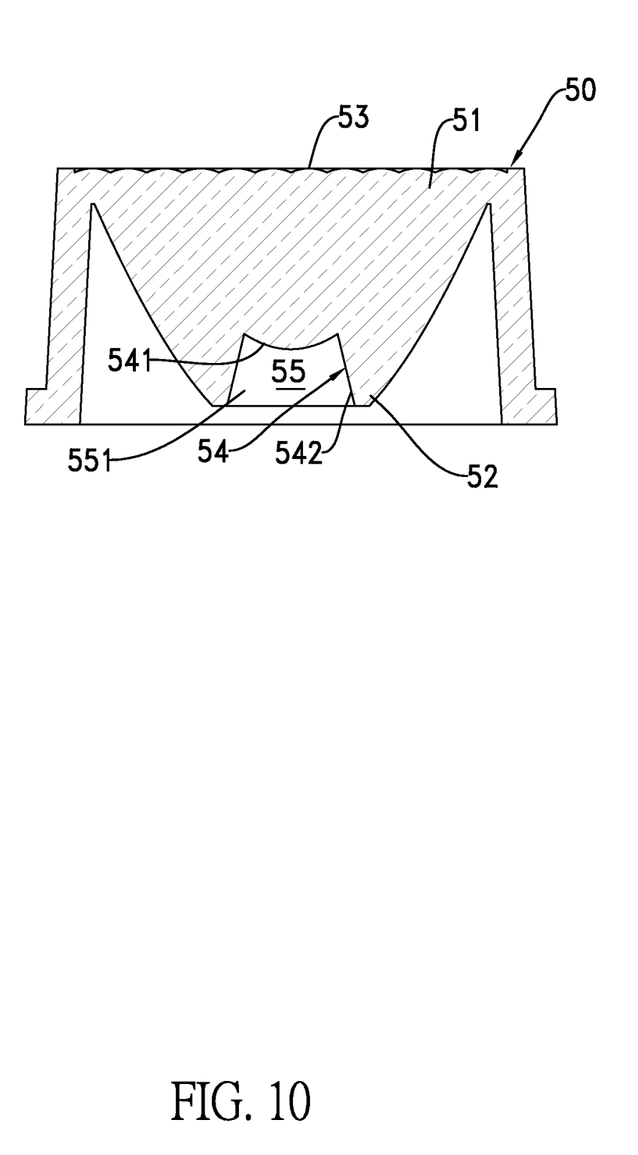
FIG. 10 is a cross sectional side view of the concentrating lens in FIG. 9.
Figure 11:
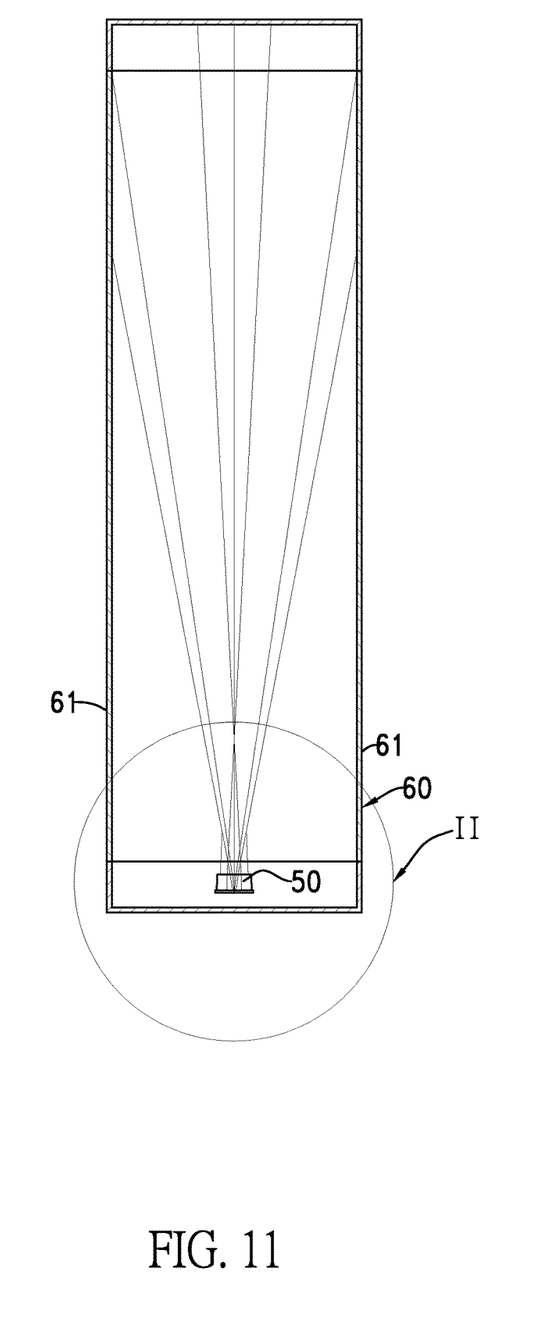
FIG. 11 is a schematic view showing an operational state of the concentrating lens in FIG. 9.
Figure 12:
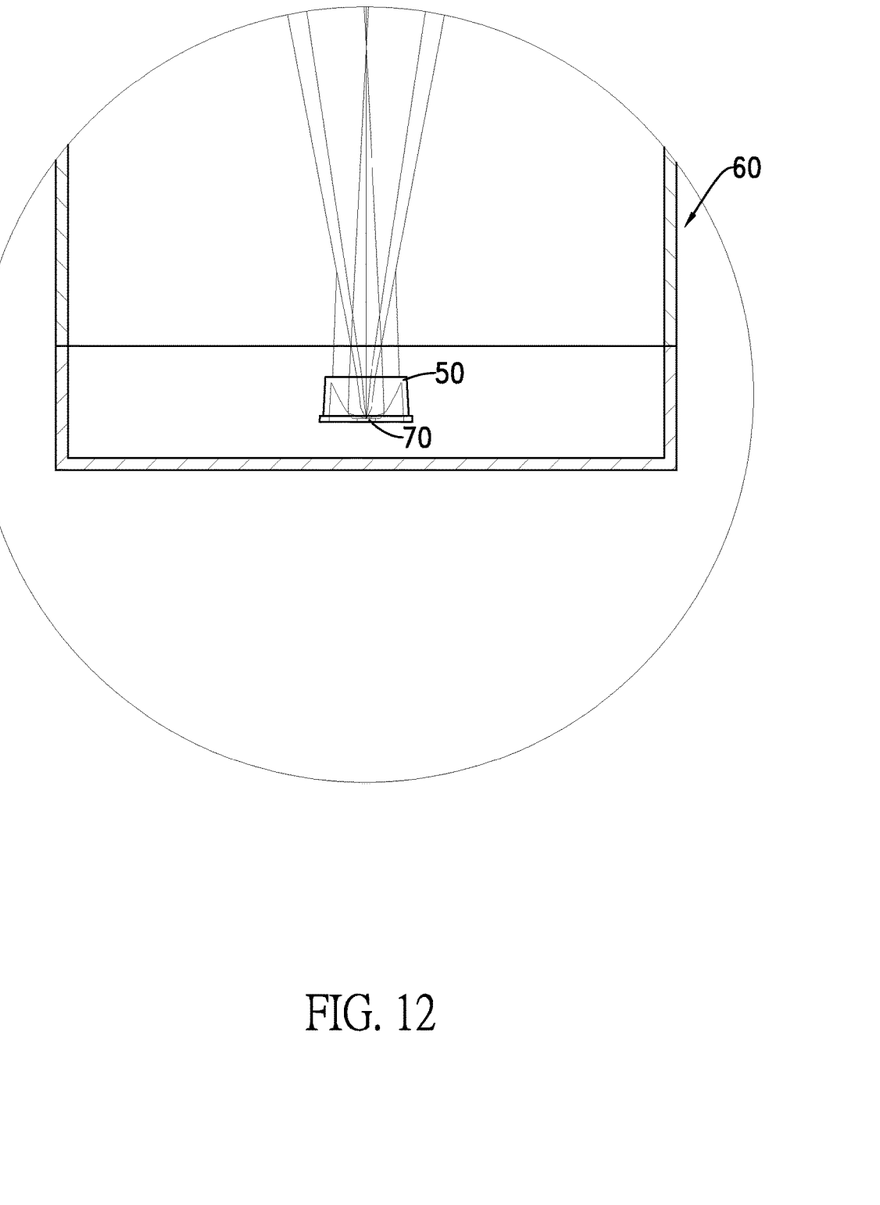
FIG. 12 is an enlarged view of an encircled area II in FIG. 11.
Figure 13:
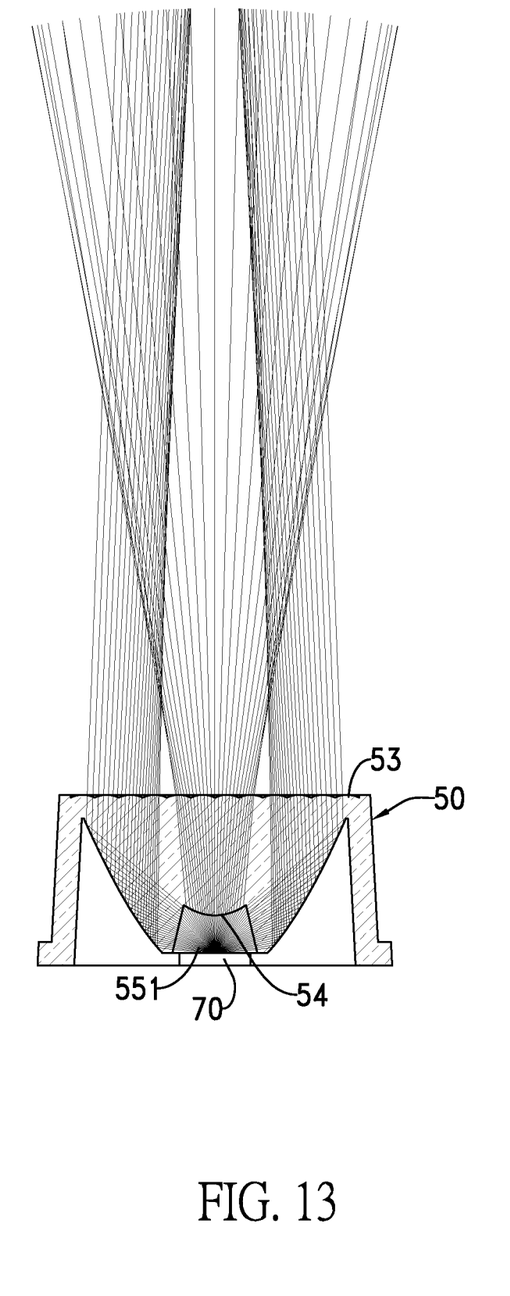
FIG. 13 is a schematic view showing an operational state of the concentrating lens in FIG. 9.

With reference to FIGS. 1 to 3, the optical surface 15 is formed concavely at the center of the light output surface 14 and towards the bottom portion 12. The top recess 16 is surrounded by the optical surface 15. The top recess 16 comprises a top opening 161 connected with the light output surface 14 and a recess base 162 opposite the top opening 161. The top recess 16 has a width decreasing gradually from the top opening 161 to the recess base 162. Further, the optical surface 15 is a pyramidal surface or a conical surface, and the top recess 16 is an inverted pyramidal recess or an inverted conical recess. In an embodiment, as shown in FIGS. 1 to 3, the optical surface 15 is a conical surface and the top recess 16 is an inverted conical recess. The top opening 161 has a width A of 2.58 mm. The top recess 16 has a depth B of 7.18 mm. The ratio of the width A of the top opening 161 to the depth B of the top recess 16 is 1:2.783.

With reference to FIGS. 2 and 3, the light input surface 17 is concavely formed on the bottom portion 12 and towards the top portion 11. The light input surface 17 and the light output surface 14 are coaxial. The light input surface 17 comprises a light input side plane 171 and a light input concave plane 172. The light input side plane 171 comprises an inner end and an outer end opposite the inner end. The light input concave plane 172 is connected with the inner end. In an embodiment, the light input concave plane 172 is a circular concave plane. A distance C between the light input concave plane 172 and the recess base 162 is 1.6 mm.

With reference to FIGS. 2 and 3, the bottom groove 18 is surrounded by the light input side plane 171. The bottom groove 18 comprises a bottom opening 181 surrounded by the outer end of the light input side plane 171 and an end opening 182 surrounded by the inner end of the light input side plane 171. The bottom groove 18 has a width decreasing gradually from the bottom opening 181 to the end opening 182. In an embodiment, a width D of the end opening 182 is 5.21 mm and a width E of the bottom opening 181 is 7.20 mm. The ratio of the width D of the end opening 182 and the width E of the bottom opening 181 is 1:1.382. The bottom groove 18 is a circular groove.

With reference to FIGS. 1 and 2, the supporting wall 20 is disposed around the lens body 10. The supporting wall 20 comprises a connecting portion 21 connected with the top portion 11 of the lens body 10. The connecting portion 21 is spaced from the bottom portion 12 of the lens body 10 and the body side surface 13 of the same. With reference to FIG. 2, in an embodiment, the supporting wall 20 and the lens body 10 are formed as one piece. The supporting wall 20 is translucent.

With reference to FIGS. 4 to 7, multiple said concentrating lenses 1 are disposed on an end or two ends of a light box 30, and the concentrating lenses 1 are spaced from each other. With reference to FIGS. 2, 4, to 6, and 8, multiple LEDs 40 are disposed at the bottom openings 181 of the concentrating lenses 1 respectively. Each of the LEDs 40 faces a corresponding light input concave plane 172. After entering each of the concentrating lenses 1 via the light input concave plane 172 and guided in the direction to the two sides of each of the concentrating lenses, the light emitted by each of the LEDs 40 departs from each of the concentrating lenses 1 via the wavy structure 141 of the light output surface 14. Then the light emitted by each of the LEDs 40 illuminates the positions on each of the side walls 31 of the light box 30 distal from each of the LEDs 40, and the positions on each the side walls 31 of the light box 30 close to each of the LEDs 40 also. In short, the light emitted by each of the LEDs 40 is distributed on the side walls 31 of the light box 30 uniformly, and the light box 30 is lighted uniformly.

Further, light emitted by each of the LEDs 40, entering each of the concentrating lenses 1 via the light input concave plane 172 and arriving at the optical surface 15, is allowed to be reflected by the optical surface 15. After reflection, the light illuminates the position on each of the side walls 31 of the light box 30 distal from each of the LEDs 40 and also the position on each of the side walls 31 of the light box 30 close to each of the LEDs 40, thereby enhancing the lighting uniformity of the light box 30.

To sum up, the concentrating lens 1 distributes the light of the LED 40 to the positions on each of the side walls 31 of a light box 30 close to and distal from the LED 40 simultaneously, and allows the light to illuminate the light box 30 uniformly.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A concentrating lens of a light emitting diode lamp comprising:
   a lens body comprising:
      a top portion;
      a bottom portion opposite the top portion;
      a light output surface positioned on the top portion;
      an optical surface formed concavely on the light output surface;
      a light input surface concavely formed on the bottom portion and towards the top portion, wherein the light input surface is positioned on a same axis with the optical surface and comprises:
         a light input side plane; and
         a light input concave plane connected with the light input side plane; and
      a top recess surrounded by the optical surface and comprising:
         a top opening connected with the light output surface;
         a recess base opposite the top opening; and a width decreasing gradually from the top opening to the recess base.

2. The concentrating lens as claimed in claim 1, wherein a ratio of a width of the top opening to a width of the recess base ranges from 1:2 to 1:3.5.

3. The concentrating lens as claimed in claim 2, wherein a distance between the light input concave plane and the recess base ranges from 1 mm to 3 mm.

4. The concentrating lens as claimed in claim 3, wherein the light input side plane comprises:
- an inner end connected with the light input concave plane; and
- an outer end opposite the inner end; and
- the lens body further comprises a bottom groove surrounded by the light input side plane and comprising:
  - a bottom opening surrounded by the outer end;
  - an end opening surrounded by the inner end; and
  - a width decreasing gradually from the bottom opening to the end opening.

5. The concentrating lens as claimed in claim 4, wherein a ratio of a width of the end opening to a width of the bottom opening ranges from 1:1.1 to 1:2.

6. The concentrating lens as claimed in claim 5, wherein the optical surface is a conical surface.

7. The concentrating lens as claimed in claim 6, wherein the light input concave plane is a circular concave plane.

8. The concentrating lens as claimed in claim 7, wherein the light output surface comprises a wavy structure.

9. The concentrating lens as claimed in claim 8, wherein a width of the top portion is larger than a width of the bottom portion, the lens body further comprises a body side surface connected between the top portion and the bottom portion, and the body side surface is a slanting surface.

10. The concentrating lens as claimed in claim 9, wherein the concentrating lens further comprises a supporting wall disposed around the lens body, the supporting wall comprises a connecting portion connected with the top portion of the lens body, and the connecting portion is spaced from the bottom portion and the body side surface.

11. The concentrating lens as claimed in claim 10, wherein the supporting wall and the lens body are formed as one piece, and the supporting wall is translucent.

12. The concentrating lens as claimed in claim 1, wherein a distance between the light input concave plane and the recess base ranges from 1 mm to 3 mm.

13. The concentrating lens as claimed in claim 1, wherein the optical surface is a conical surface.

14. The concentrating lens as claimed in claim 1, wherein the light input concave plane is a circular concave plane.

15. The concentrating lens as claimed in claim 1, wherein the light output surface comprises a wavy structure.

16. The concentrating lens as claimed in claim 1, wherein a width of the top portion is larger than a width of the bottom portion, the lens body further comprises a body side surface connected between the top portion and the bottom portion, and the body side surface is a slanting surface.

17. The concentrating lens as claimed in claim 1, wherein the concentrating lens further comprises a supporting wall disposed around the lens body, the supporting wall comprises a connecting portion connected with the top portion of the lens body, and the connecting portion is spaced from the bottom portion.

* * * * *